(12) United States Patent
Kimura

(10) Patent No.: US 12,470,197 B2
(45) Date of Patent: Nov. 11, 2025

(54) ACOUSTIC WAVE DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 231 days.

(21) Appl. No.: 18/211,739

(22) Filed: Jun. 20, 2023

(65) Prior Publication Data

US 2023/0336143 A1    Oct. 19, 2023

Related U.S. Application Data

(63) Continuation of application No. PCT/JP2021/046580, filed on Dec. 16, 2021.

(60) Provisional application No. 63/129,698, filed on Dec. 23, 2020.

(51) Int. Cl.
H03H 9/02    (2006.01)

(52) U.S. Cl.
CPC .... H03H 9/02228 (2013.01); H03H 9/02015 (2013.01); H03H 9/02102 (2013.01)

(58) Field of Classification Search
CPC ........... H03H 9/02228; H03H 9/02015; H03H 9/02102; H03H 9/02062; H03H 9/02157; H03H 9/174
USPC .................. 333/187, 188, 193–196
See application file for complete search history.

(56) References Cited

U.S. PATENT DOCUMENTS

| | | | |
|---|---|---|---|
| 9,748,923 B2 * | 8/2017 | Kando ............... | H03H 9/02559 |
| 2014/0001919 A1 * | 1/2014 | Komatsu ............ | H03H 9/02818 310/313 B |
| 2014/0145556 A1 | 5/2014 | Kadota | |
| 2019/0386638 A1 | 12/2019 | Kimura et al. | |
| 2020/0186124 A1 | 6/2020 | Kasamatsu et al. | |

(Continued)

FOREIGN PATENT DOCUMENTS

| | | |
|---|---|---|
| WO | 2013021948 A1 | 2/2013 |
| WO | 2018163860 A1 | 9/2018 |
| WO | 2019009373 A1 | 1/2019 |

(Continued)

OTHER PUBLICATIONS

International Search Report in PCT/JP2021/046580, mailed Mar. 1, 2022, 3 pages.

(Continued)

*Primary Examiner* — Jorge L Salazar, Jr.

(74) *Attorney, Agent, or Firm* — Keating & Bennett, LLP

(57) ABSTRACT

An acoustic wave device includes a support, a piezoelectric layer, an IDT electrode including first and second busbars and first and second electrode fingers, and a dielectric film provided on the piezoelectric layer so as to overlap at least a portion of the IDT electrode in plan view. When a thickness of the piezoelectric layer is d and a center-to-center distance between centers of adjacent ones of the electrode fingers is p, d/p is less than or equal to about 0.5. A cavity that opens on a side of the piezoelectric layer is provided in the support. The IDT electrode includes an intersection region, and first and second gap regions. The dielectric film is provided at at least a portion of the first and second gap regions, and a thermal conductivity of the dielectric film is higher than a thermal conductivity of the piezoelectric layer.

20 Claims, 12 Drawing Sheets

(56) References Cited

U.S. PATENT DOCUMENTS

2021/0175872 A1 6/2021 Daimon
2022/0069803 A1 3/2022 Nozoe

FOREIGN PATENT DOCUMENTS

WO 2020045442 A1 3/2020
WO 2020130128 A1 6/2020

OTHER PUBLICATIONS

Written Opinion in PCT/JP2021/046580, mailed Mar. 1, 2022, 4 pages.

\* cited by examiner

ACOUSTIC WAVE DEVICE

CROSS REFERENCE TO RELATED APPLICATIONS

This application claims the benefit of priority to Provisional Application No. 63/129,698 filed on Dec. 23, 2020 and is a Continuation Application of PCT Application No. PCT/JP2021/046580 filed on Dec. 16, 2021. The entire contents of each application are hereby incorporated herein by reference.

BACKGROUND OF THE INVENTION

1. Field of the Invention

The present invention relates to an acoustic wave device.

2. Description of the Related Art

Hitherto, an acoustic wave device has been widely used in, for example, a filter of a cellular phone. International Publication No. 2013/021948 discloses an example of an acoustic wave device. In the acoustic wave device, a recessed portion is provided above a support member. A piezoelectric thin film is provided on the support member so as to cover the recessed portion. An IDT (interdigital transducer) electrode is provided on a portion of the piezoelectric thin film, the portion covering the recessed portion.

SUMMARY OF THE INVENTION

When a voltage is applied to the IDT electrode and an acoustic wave is excited, heat is produced at a portion where the IDT electrode is provided. However, in the acoustic wave device described in International Publication No. 2013/021948, the piezoelectric thin film and the support member are not in contact with each other at a portion where the recessed portion is provided at the support member. Therefore, it is difficult to sufficiently increase heat dissipation.

Preferred embodiments of the present invention provide acoustic wave devices each being capable of increasing heat dissipation in a structure in which a support includes a cavity portion.

An acoustic wave device according to a preferred embodiment of the present invention includes a support including a support substrate, a piezoelectric layer on the support, an IDT electrode on the piezoelectric layer and including two busbars and a plurality of electrode fingers, the two busbars being a busbar pair and facing each other, and a dielectric film provided on the piezoelectric layer so as to overlap at least a portion of the IDT electrode in plan view, in which a ratio d/p is less than or equal to about 0.5, where a thickness of the piezoelectric layer is d and a center-to-center distance between the centers of adjacent ones of the electrode fingers is p, a cavity portion that opens on a side of the piezoelectric layer is provided in the support, and, in plan view, at least a portion of the IDT electrode and the cavity portion overlap each other, the IDT electrode includes an intersection region and two gap regions, the intersection region being a region in which the adjacent ones of the electrode fingers overlap each other when viewed in a direction in which the adjacent ones of the electrode fingers face each other, the two gap regions each being positioned between the intersection region and a corresponding one of the two busbars, and in which the dielectric film is provided at at least a portion of the two gap regions, and a thermal conductivity of the dielectric film is higher than a thermal conductivity of the piezoelectric layer.

According to the acoustic wave devices according to preferred embodiments of the present invention, it is possible to increase heat dissipation in a structure in which the support includes a cavity portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
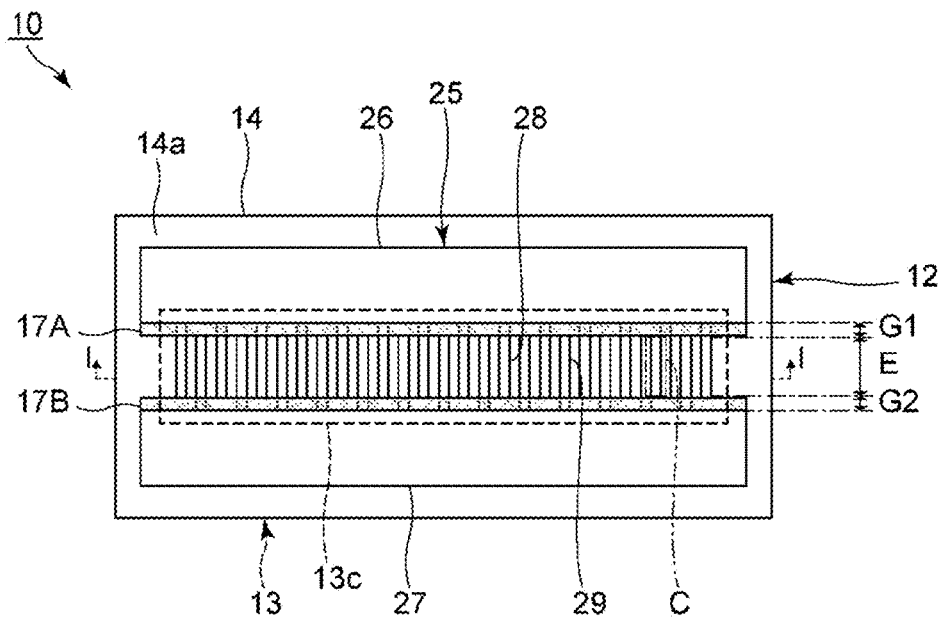
FIG. 1 is a plan view of an acoustic wave device according to a first preferred embodiment of the present invention.

While referring to the drawings, specific preferred embodiments of the present invention will be described below to clarify the present invention.

Note that each preferred embodiment described in the present description is an exemplification, and it will be pointed out that structures of different preferred embodiments can be partly replaced or combined.

Figure 2:
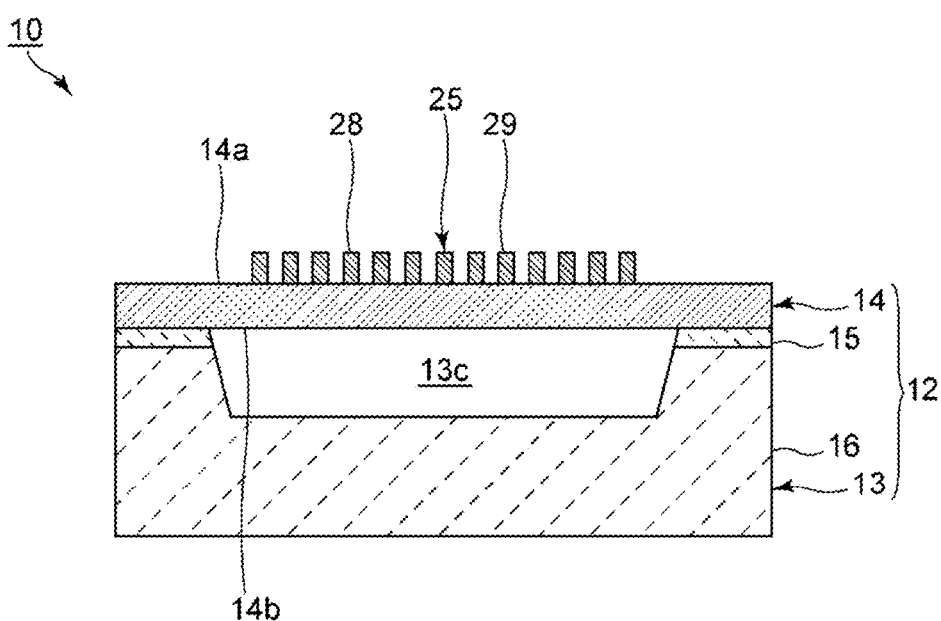
FIG. 2 is a schematic cross-sectional view along line I-I in FIG. 1.

FIG. 1 is a plan view of an acoustic wave device according to a first preferred embodiment of the present invention. FIG. 2 is a schematic cross-sectional view along line I-I in FIG. 1. Note that, in FIG. 1, dielectric films described below are shown by hatching. This also applies to plan views other than FIG. 1.

As shown in FIG. 1, an acoustic wave device 10 includes a piezoelectric substrate 12 and an IDT electrode 25. As shown in FIG. 2, the piezoelectric substrate 12 includes a support member 13 and a piezoelectric layer 14. In the present preferred embodiment, the support member 13 includes a support substrate 16 and an insulating layer 15. The insulating layer 15 is provided on the support substrate 16. The piezoelectric layer 14 is provided on the insulating layer 15. However, the support member 13 may be defined by only the support substrate 16.

A cavity portion 13c is provided in the support member 13. More specifically, a through hole is provided in the insulating layer 15. A recessed portion is provided in the support substrate 16 so as to communicate with the through hole of the insulating layer 15. The piezoelectric layer 14 is provided on the insulating layer 15 so as to close the through hole. Therefore, the cavity portion 13c of the support member 13 is formed. The cavity portion 13c opens on a side of the piezoelectric layer 14.

As a material of the insulating layer 15, an appropriate dielectric, such as silicon oxide or tantalum pentoxide, can be used. As a material of the support substrate 16, for example, a semiconductor, such as silicon, or an appropriate ceramic material can be used.

The piezoelectric layer 14 includes a first main surface 14a and a second main surface 14b. The first main surface 14a and the second main surface 14b face each other. Of the first main surface 14a and the second main surface 14b, the second main surface 14b is the main surface on a side of the support member 13. In the present preferred embodiment, the piezoelectric layer 14 is made of, for example, lithium niobate, such as LiNbO$_3$ (LN). Note that the piezoelectric layer 14 may be made of lithium tantalate, such as LiTaO$_3$. In the present description, "a certain member is made of a certain material" includes a case in which a very small amount of impurities that does not cause deterioration in the electrical characteristics of the acoustic wave device is contained.

The IDT electrode 25 is provided on the first main surface 14a of the piezoelectric layer 14. At least a portion of the IDT electrode 25 overlaps the cavity portion 13c of the support member 13 in plan view. In the present description, "in plan view" refers to a view from a direction corresponding to an upper direction in FIG. 2.

Referring back to FIG. 1, the IDT electrode 25 includes a first busbar 26 and a second busbar 27, which are a pair of busbars, a plurality of first electrode fingers 28, and a plurality of second electrode fingers 29. The first busbar 26 and the second busbar 27 face each other. One end portion of each of the plurality of first electrode fingers 28 is connected to the first busbar 26. One end portion of each of the plurality of second electrode fingers 29 is connected to the second busbar 27. The plurality of first electrode fingers 28 and the plurality of second electrode fingers 29 interdigitate with respect to each other. The IDT electrode 25 may be formed from a multilayer metal film, or may be formed from a single-layer metal film. In the description below, the first electrode fingers 28 and the second electrode fingers 29 may simply be referred to as electrode fingers. Note that, although not illustrated, wiring electrodes are provided on the first busbar 26 and the second busbar 27. The wiring electrodes are connected to, for example, other elements or external devices.

When a direction in which electrode fingers that are adjacent to each other face each other is an electrode-finger facing direction, in the present preferred embodiment, as shown in FIG. 1, the electrode-finger facing direction is orthogonal to an electrode-finger extending direction. A region in which the electrode fingers that are adjacent to each other overlap each other when viewed from the electrode-finger facing direction is an intersection region E. The intersection region E is a region including a portion of the IDT electrode 25 from an electrode finger at one end in the electrode-finger facing direction to an electrode finger on the other end in the electrode-finger facing direction. More specifically, the intersection region E includes a portion from an outer edge portion in the electrode-finger facing direction of the electrode finger at the one end to an outer edge portion in the electrode-finger facing direction of the electrode finger at the other end.

Further, the acoustic wave device 10 includes a plurality of excitation regions C. Acoustic waves are excited in the plurality of excitation regions C by applying an alternating-current voltage to the IDT electrode 25. In the present preferred embodiment, the acoustic wave device 10 is configured to be capable of using, for example, bulk waves in a thickness shear mode, such as a thickness shear primary mode. Similarly to the intersection region E, each excitation region C is a region in which the electrode fingers that are adjacent to each other overlap each other when viewed from the electrode-finger facing direction. Note that each excitation region C is a region between a pair of electrode fingers. More specifically, each excitation region C is a region from the center of one of the electrode fingers in the electrode-finger facing direction to the center of the other electrode finger in the electrode-finger facing direction.

In the present preferred embodiment, when the thickness of the piezoelectric layer 14 is d and the center-to-center distance between the centers of electrodes that are adjacent to each other is p, d/p is less than or equal to about 0.5, for example. This makes it possible to appropriately excite thickness shear mode.

Further, the IDT electrode 25 includes a first gap region G1 and a second gap region G2 as a pair of gap regions. More specifically, the first gap region G1 is positioned between the intersection region E and the first busbar 26. The second gap region G2 is positioned between the intersection region E and the second busbar 27.

A dielectric film 17A is provided at the first gap region G1. More specifically, the dielectric film 17A is provided at a portion where the first gap region G1 is positioned at the first main surface 14a of the piezoelectric layer 14 so as to cover the IDT electrode 25. The dielectric film 17A has a strip shape. One dielectric film 17A covers all of the electrode fingers. The dielectric film 17A is also provided at regions between the electrode fingers at the first main surface 14a. Note that it is sufficient for the dielectric film 17A to be provided at at least a portion of the first gap region G1.

Similarly, a dielectric film 17B is provided at the second gap region G2. The dielectric film 17B has a strip shape and covers all of the electrode fingers at the second gap region G2. Note that it is sufficient for the dielectric film 17B to be provided at at least a portion of the second gap region G2.

One of the unique features of the present preferred embodiment is that the dielectric film 17A and the dielectric film 17B are provided at the first gap region G1 and the second gap region G2, respectively, and that the thermal conductivities of the dielectric film 17A and the dielectric film 17B are higher than the thermal conductivity of the piezoelectric layer 14. Therefore, it is possible to increase heat dissipation in a structure in which the support member 13 has the cavity portion 13c. The details thereof are described below by using a reference example and a comparative example.

The reference example differs from the present preferred embodiment in that a cavity portion is not provided in a support member and in that a dielectric film 17A and a dielectric film 17B are not provided. The comparative example differs from the present preferred embodiment in that a dielectric film 17A and a dielectric film 17B are not provided.

When electric power is applied to the acoustic wave device and acoustic waves are excited, heat is produced in the excitation regions. A relationship between input power and temperature increase in the reference example and the comparative example is shown in FIG. 3 below.

Figure 3:
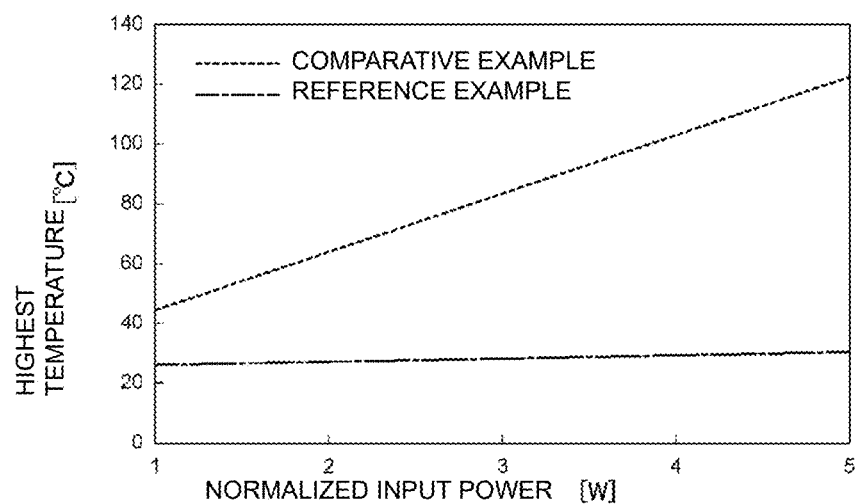
FIG. 3 is a graph showing a relationship between normalized input power and a highest temperature in an excitation region in a reference example and a comparative example.

FIG. 3 is a graph showing a relationship between normalized input power and a highest temperature in an excitation region in the reference example and the comparative example.

As shown in FIG. 3, in the reference example, even if the normalized input power is increased, the temperature increase in the excitation region is small. On the other hand, in the comparative example, as the normalized input power is increased, the temperature increases considerably. In the reference example, an entire portion where an IDT electrode is provided at a piezoelectric layer is in contact with a support member. Therefore, heat that has been produced is dissipated on a side of the support member. On the other hand, as in the comparative example, in a structure in which a support member has a cavity portion, a piezoelectric layer is not in contact with the support member at a portion where the cavity portion is provided. Therefore, heat dissipation is reduced.

In contrast, in the present preferred embodiment shown in FIG. 1, although the support member 13 includes the cavity portion 13c, it is possible to increase heat dissipation. This is described by simulation results below. More specifically, in the acoustic wave device 10 having the structure of the present preferred embodiment, a relationship between the highest temperature in an excitation region C and the thermal conductivities of the dielectric film 17A and the dielectric film 17B was determined by simulation. Note that design parameters of the acoustic wave device 10 are as follows. Here, an electrode-finger pitch is a center-to-center distance between the centers of adjacent electrode fingers. The width of an electrode finger is a dimension along the electrode-finger facing direction of the electrode finger. The width of a gap region is a dimension along the electrode-finger extending direction of each of the first gap region G1 and the second gap region G2. An intersection width is a dimension along the electrode-finger extending direction of the intersection region E.

Piezoelectric layer 14: material . . . ZYLN, thickness . . . 500 nm

Insulating layer 15: material . . . $SiO_2$, thickness 600 nm

Support substrate 16: material . . . Si, thickness 250 μm

IDT electrode 25: material . . . Al, thickness 500 nm

Wiring electrodes on two busbars: material . . . Al, thickness 3 μm

Electrode finger pitch: 4.55 μm

Number of electrode fingers: 80

Electrode finger width: 1.1 μm

Gap region width: 3.45 μm

Intersection width: 50 μm

Input power: equivalent to 200 mW

Since the material of the piezoelectric layer 14 is ZYLN, the thermal conductivity of the piezoelectric layer 14 is about 38 W/mk, for example. Therefore, in the simulation, the thermal conductivity of the dielectric film 17A and the thermal conductivity of the dielectric film 17B were lower than about 38 W/mk, for example. Specifically, a silicon nitride film having a thickness of about 3 μm was used for the dielectric film 17A and the dielectric film 17B, for example. Note that, as the comparative example when a dielectric film 17A and a dielectric film 17B are not provided, the result of a case in which the thermal conductivity of the dielectric film 17A and the thermal conductivity of the dielectric film 17B are 0 is also given.

Figure 4:
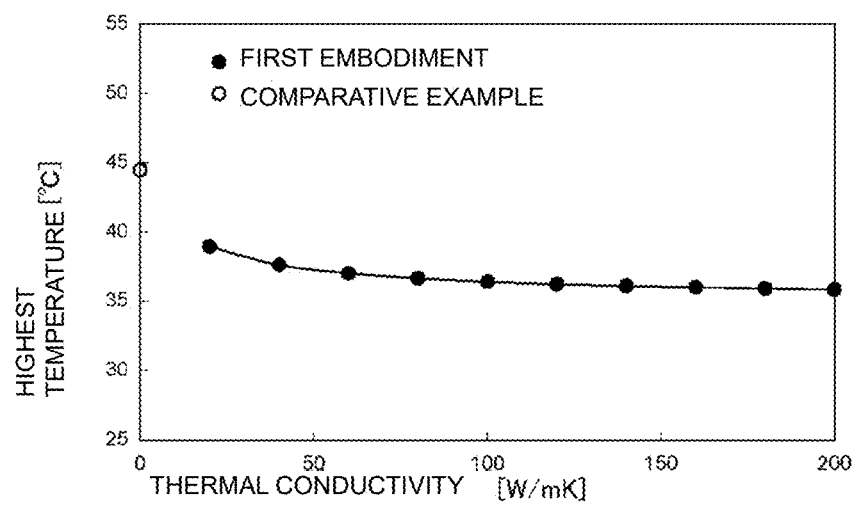
FIG. 4 is a graph showing a relationship between the thermal conductivity of each dielectric film and a highest temperature in an excitation region.

FIG. 4 is a graph showing a relationship between the thermal conductivity of each dielectric film and the highest temperature in an excitation region.

FIG. 4 shows that, as the thermal conductivity of the dielectric film 17A and the thermal conductivity of the dielectric film 17B increase, the highest temperature of the excitation region decreases. In this way, in the first preferred embodiment, heat dissipation can be increased in the structure in which the support member 13 has the cavity portion 13c. The reasons are as follows.

Of the first electrode fingers 28 and the second electrode fingers 29, only the first electrode fingers 28 are provided at the first gap region G1. Of the first electrode fingers 28 and the second electrode fingers 29, only the second electrode fingers 29 are provided at the second gap region G2. Therefore, at the first gap region G1 and the second gap region G2, heat dissipation is lower than the heat dissipation of the intersection region E.

On the other hand, in the present preferred embodiment, the dielectric film 17A is provided at the first gap region G1, and the dielectric film 17B is provided at the second gap region G2. Further, the thermal conductivity of the dielectric film 17A and the thermal conductivity of the dielectric film 17B are higher than the thermal conductivity of the piezoelectric layer 14. Therefore, even at the first gap region G1 and the second gap region G2, it is possible to increase heat dissipation. In addition, it is possible to effectively propagate heat from the intersection region E to the first busbar 26 and the second busbar 27 through the first gap region G1 and the second gap region G2, respectively. In this way, it is possible to reduce or prevent heat from being confined on a side of the intersection region E. Therefore, it is possible to increase heat dissipation of the acoustic wave device 10.

Note that it is sufficient for at least one of the dielectric film 17A and the dielectric film 17B to be provided. Even in this case, at the first gap region G1 or the second gap region G2, it is possible to increase heat dissipation by the dielectric film 17A or the dielectric film 17B. Therefore, it is possible to increase the heat dissipation of the acoustic wave device 10 as a whole.

In the present preferred embodiment, one strip-shaped dielectric film 17A is provided at the first gap region G1. Note that, when the dielectric film 17A is provided, it is sufficient for the dielectric film 17A to be provided at at least a portion of the first gap region G1. For example, a plurality of dielectric films 17A may be disposed side by side in a direction parallel to the electrode-finger facing direction. Not all of the first electrode fingers 28 need to be covered by the dielectric film 17A. The dielectric film 17A need not be provided at portions between all the electrode fingers on the piezoelectric layer 14. However, it is preferable that the dielectric film 17A be provided at the entire first gap region G1. Therefore, it is possible to effectively increase heat dissipation.

Similarly, when the dielectric film 17B is provided, it is sufficient for the dielectric film 17B to be provided at at least a portion of the second gap region G2. However, it is preferable that the dielectric film 17B be provided at the entire second gap region G2.

It is preferable that the dielectric film 17A and the dielectric film 17B be made of aluminum nitride, aluminum oxide, beryllium oxide, silicon carbide, or silicon nitride. Since these materials have high thermal conductivity, it is possible to effectively increase heat dissipation of the acoustic wave device 10.

It is preferable that the thickness of the dielectric film 17A and the thickness of the dielectric film 17B be greater than or equal to about 100 nm, for example. This makes it possible to properly increase heat dissipation. On the other hand, it is preferable that the thickness of the dielectric film 17A and the thickness of the dielectric film 17B be less than or equal to about 3 μm, for example. In this case, it is possible to easily form the dielectric film 17A and the dielectric film 17B.

As described above, in the present preferred embodiment, the dielectric film 17A is provided on the first main surface 14a of the piezoelectric layer 14 at the first gap region G1 so as to cover the IDT electrode 25. That is, at a portion in which the IDT electrode 25 and the dielectric film 17A are placed upon each other, the piezoelectric layer 14, the IDT electrode 25, and the dielectric film 17A are placed upon each other in this order. This also applies to the dielectric film 17B. Therefore, it is possible to protect the IDT electrode 25 and to make it unlikely for the IDT electrode 25 to be damaged.

Figure 5:
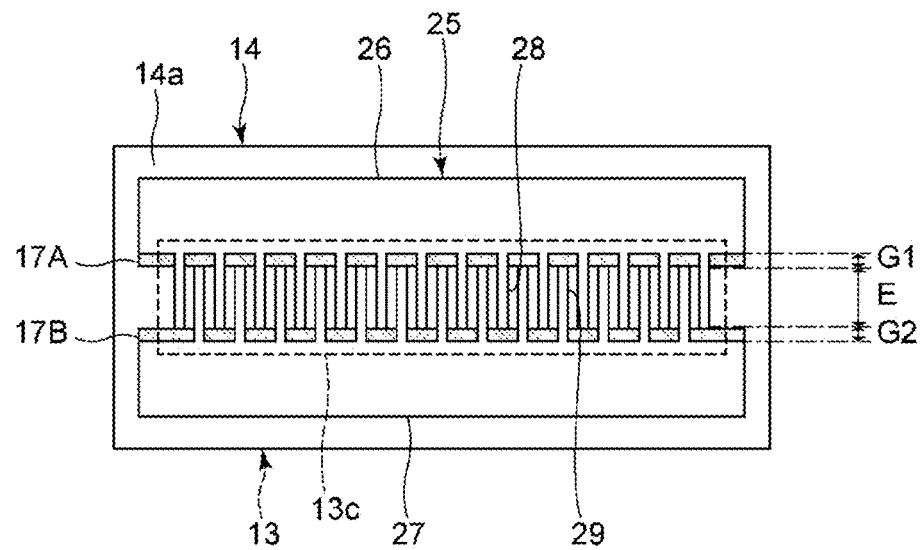
FIG. 5 is a plan view of an acoustic wave device according to a first modification of the first preferred embodiment of the present invention.

However, the order in which the IDT electrode 25 and the dielectric film 17A are placed upon each other is not limited to the aforementioned order. In a first modification of the first preferred embodiment shown in FIG. 5, the dielectric film 17A is provided between the first main surface 14a and the IDT electrode 25. That is, at the portion in which the IDT electrode 25 and the dielectric film 17A are placed upon each other, the piezoelectric layer 14, the dielectric film 17A, and the IDT electrode 25 are placed upon each other in this order. This also applies to the dielectric film 17B. Even in this case, heat dissipation can be increased in the structure in which the support member 13 includes the cavity portion 13c.

In the present preferred embodiment, as shown in FIG. 2, the cavity portion 13c is formed in both of the support substrate 16 and the insulating layer 15. However, the structure of the support member is not limited to the above-described structure. In the description below, a second modification and a third modification of the first preferred embodiment that differ from the first preferred embodiment in only the structure of the support member are described. Similarly to the first preferred embodiment, even in the second modification and the third modification, it is possible to increase heat dissipation in a structure in which the support member has a cavity portion.

Figure 6:
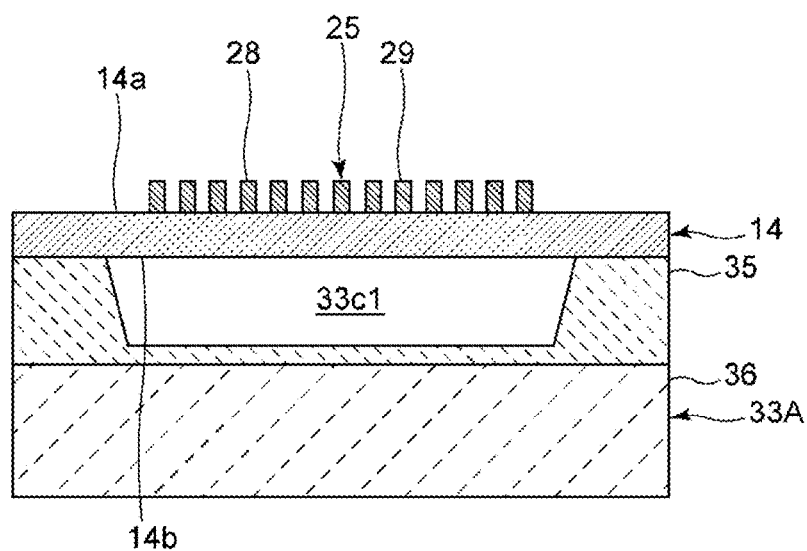
FIG. 6 is a schematic elevational cross-sectional view of an acoustic wave device according to a second modification of the first preferred embodiment of the present invention.

In the second modification shown in FIG. 6, a recessed portion is provided in only an insulating layer 35. A recessed portion is not provided in a support substrate 36. Therefore, a cavity portion 33cl of a support member 33A is formed in only the insulating layer 35. Note that a structure in which a through hole is provided in only the insulating layer 15 shown in FIG. 2 as in the first preferred embodiment and a recessed portion is not provided in the support substrate 36 may be used.

Figure 7:
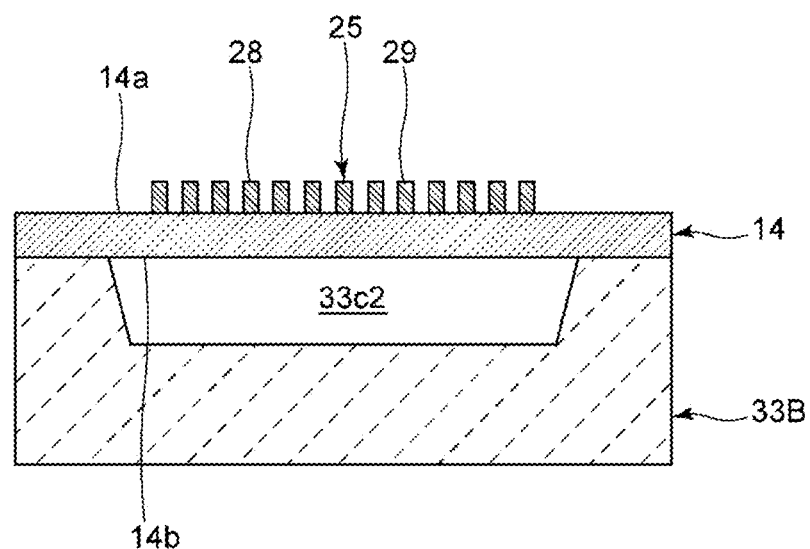
FIG. 7 is a schematic elevational cross-sectional view of an acoustic wave device according to a third modification of the first preferred embodiment of the present invention.

In the third modification shown in FIG. 7, a support member 33B does not have an insulating layer. The support member 33B is defined by only a support substrate. Similarly to the first preferred embodiment, a recessed portion is provided in the support substrate. Therefore, a cavity portion 33c2 of the support member 33B is formed in only the support substrate.

Note that the structure of each modification of the present preferred embodiment can also be applied to structures of preferred embodiments of the present invention other than the structure of the present preferred embodiment.

As shown in FIG. 2, in the acoustic wave device 10, the dielectric film 17A is provided at only the first gap region G1. The dielectric film 17B is provided at only the second gap region G2. However, the dielectric films in preferred embodiments of the present invention may reach a corresponding one of an outer side of the first gap region G1 and an outer side of the second gap region G2. This example is described in a second preferred embodiment to a fourth preferred embodiment below. The second to fourth preferred embodiments differ from the first preferred embodiment in that dielectric films are provided at a corresponding one of a first gap region G1 and a second gap region G2, and reach a corresponding one of an outer side of the first gap region G1 and an outer side of the second gap region G2. In terms of points other than the aforementioned points, the structures of acoustic wave devices of the second to fourth preferred embodiments are the same as the structure of the acoustic wave device 10 of the first preferred embodiment. Even in the second to fourth preferred embodiments, similarly to the first preferred embodiment, it is possible to increase heat dissipation in a structure in which a support member 13 has a cavity portion 13c.

Figure 8:
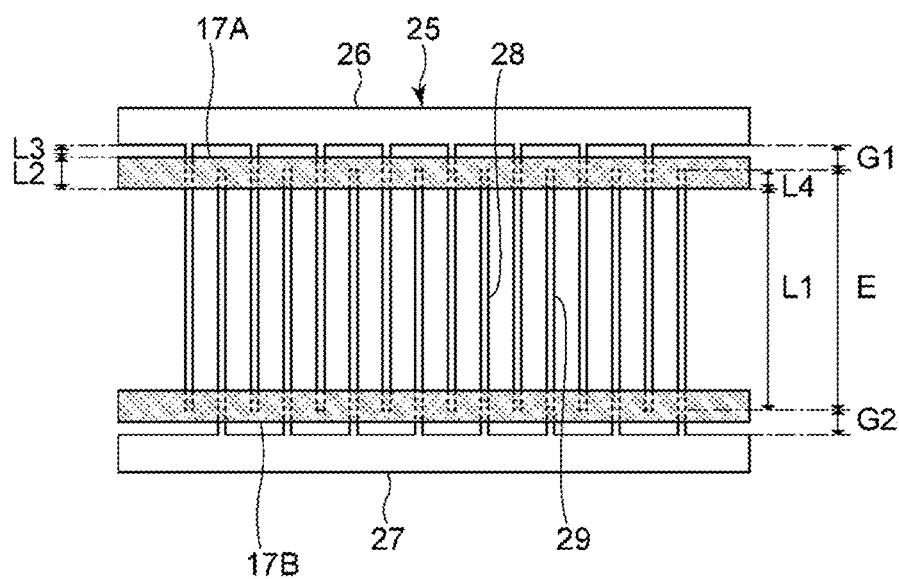
FIG. 8 is a plan view showing an IDT electrode and dielectric films of a second preferred embodiment of the present invention.

FIG. 8 is a plan view showing an IDT electrode and dielectric films of the second preferred embodiment.

In the present preferred embodiment, in plan view, tip end portions of a plurality of second electrode fingers 29 and a dielectric film 17A overlap each other. As shown in FIG. 8, the dielectric film 17A is provided at an end portion of an intersection region E on a side of a first busbar 26, the end portion being an end portion in the electrode-finger extending direction. The dielectric film 17A is not provided at portions other than the end portion of the intersection region E and a first gap region G1. A dimension along the electrode-finger extending direction of a portion of the dielectric film 17A where the end portion of the intersection region E on the side of the first busbar 26 is provided is less than or equal to about 20% of an intersection width, for example.

On the other hand, in plan view, tip end portions of a plurality of first electrode fingers 28 and a dielectric film 17B overlap each other. The dielectric film 17B is provided at an end portion of the intersection region E on a side of a second busbar 27, the end portion being an end portion in the electrode-finger extending direction. The dielectric film 17B is not provided at portions other than the end portion of the intersection region E and a second gap region G2. A dimension along the electrode-finger extending direction of a portion of the dielectric film 17B where the end portion of the intersection region E on the side of the second busbar 27 is provided is less than or equal to about 20% of the intersection width, for example.

The total of the dimensions in the electrode-finger extending direction of a portion of the dielectric film 17A and a portion of the dielectric film 17B provided at a corresponding one of the two end portions of the intersection region E is less than or equal to about 40% of the intersection width, for example. The total of the dimensions in the electrode-finger extending direction of the portion of the dielectric film 17A and the portion of the dielectric film 17B provided at the corresponding one of the two end portions of the intersection region E is preferably less than or equal to about 20% of the intersection width and is more preferably less than or equal to about 10% of the intersection width, for example. Therefore, it is unlikely for excitation of acoustic waves to be prevented and it is possible to reliably reduce or prevent deterioration of the characteristics of the acoustic wave device.

Note that, as described above, the dielectric film 17A and the dielectric film 17B are provided over the respective gap regions and the intersection region E. The total of the width of the dielectric film 17A and the width of the dielectric film 17B is more preferably less than equal to about 10% of the intersection width, for example. More specifically, the total of the dimensions in the electrode finger extending direction of the portions of the dielectric films provided at the corresponding one of the two end portions of the intersection region E and the dimensions in the electrode-finger extending direction of the portions of the dielectric films provided at the respective gap regions is more preferably less than or equal to about 10% of the intersection width, for example. The details thereof will be given below.

The width of the dielectric film 17A and the width of the dielectric film 17B are a dimension of the dielectric film 17A in the electrode-finger extending direction and a dimension of the dielectric film 17B in the electrode-finger extending direction, respectively. A plurality of acoustic wave devices having the same structure as the structure of the present preferred embodiment and whose dielectric film widths differed were prepared. More specifically, when the dimensions in the electrode-finger extending direction of the portion of the dielectric film 17A and the portion of the dielectric film 17B provided at the corresponding one of the two end portions of the intersection region E are overlap dimensions, only the overlap dimensions differed among the plurality of acoustic wave devices. Note that, in the acoustic wave devices, the width of the dielectric film 17A and the width of the dielectric film 17B are the same. In each of the acoustic wave devices, the impedances of a resonance point and an anti-resonance point were measured and an impedance ratio between the impedance at the resonance point and the impedance at the anti-resonance point was calculated. Note that design parameters of the acoustic wave devices related to the above-described measurement are as follows.

Figure 9:
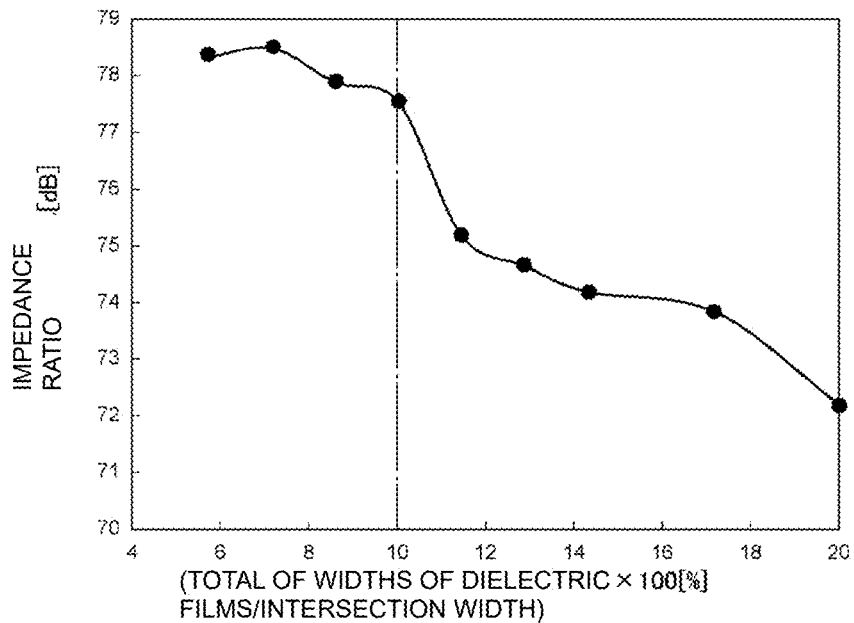
FIG. 9 is a graph showing a relationship between an impedance ratio and a proportion of a total of the widths of dielectric films to an intersection width.

Piezoelectric layer 14: material . . . ZYLN, thickness . . . 500 nm
Insulating layer 15: material . . . $SiO_2$, thickness 600 nm
Support substrate 16: material . . . Si, thickness 250 μm
IDT electrode 25: material . . . Al, thickness 500 nm
Wiring electrodes on two busbars: material . . . Al, thickness 3 μm
Electrode finger pitch: 4.55 μm
Number of electrode fingers: 80
Electrode finger width: 1.1 μm
Gap region width: 3.45 μm
Intersection width: 70 μm Further, in plan view, the distance from a first busbar 26 to the dielectric film 17A was about 2 μm, for example. Similarly, in plan view, the distance from a second busbar 27 to the dielectric film 17B was about 2 μm, for example. For the dielectric film 17A and the dielectric film 17B, a silicon nitride film having a thickness of about 1.2 μm was used, for example. Table 1 below and FIG. 9 show the results of the measurement. Note that the intersection width is L1, the dielectric film width is L2, the distance between a busbar and a dielectric film is L3, and the overlap dimension is L4. In the dielectric film 17A and the dielectric film 17B, L2 to L4 are the same.

TABLE 1

| Intersection width [μm] L1 | Dielectric film width [μm] L2 | Distance between busbar and dielectric film [μm] L3 | Overlap dimension [μm] L4 | Total of dielectric film widths [μm] L2 × 2 | (Total of dielectric film widths/intersection width × 100 [%] L2 × 2/L1 | Impedance ratio [dB] |
|---|---|---|---|---|---|---|
| 70 | 2 | 2 | 0 | 4 | 5.7 | 78.36 |
| 70 | 2.5 | 2 | 0.5 | 5 | 7.1 | 78.52 |
| 70 | 3 | 2 | 1 | 6 | 8.6 | 77.91 |
| 70 | 3.5 | 2 | 1.5 | 7 | 10.0 | 77.55 |
| 70 | 4 | 2 | 2 | 8 | 11.4 | 75.19 |
| 70 | 4.5 | 2 | 2.5 | 9 | 12.9 | 74.65 |
| 70 | 5 | 2 | 3 | 10 | 14.3 | 74.19 |
| 70 | 6 | 2 | 4 | 12 | 17.1 | 73.84 |
| 70 | 7 | 2 | 5 | 14 | 20.0 | 72.17 |

FIG. 9 is a graph showing a relationship between the impedance ratio and the proportion of the total of the widths of the dielectric films to the intersection width.

FIG. 9 shows that the impedance ratio is considerably larger when the total of the width of the dielectric film 17A and the width of the dielectric film 17B is less than or equal to about 10% of the intersection width than when the total is greater than about 10% of the intersection width, for example. Therefore, the total of the width of the dielectric film 17A and the width of the dielectric film 17B is preferably less than or equal to about 10% of the intersection width, for example. Specifically, the total of the overlap dimension of the dielectric film 17A and the overlap dimension of the dielectric film 17B and the dimensions in the electrode-finger extending direction of the portions of the dielectric films 17A and 17B provided at the respective gap regions is preferably less than or equal to about 10% of the intersection width, for example. In this case, it is possible to effectively reduce or prevent deterioration of the characteristics of the acoustic wave devices.

Note that, in Table 1 and FIG. 9, the case in which the total of the width of the dielectric film 17A and the width of the dielectric film 17B is less than or equal to about 10% corresponds to a case in which the total of the overlap dimension of the dielectric film 17A and the overlap dimension of the dielectric film 17B is less than or equal to about 4.3% of the intersection region, for example. Therefore, the total of the overlap dimension of the dielectric film 17A and the overlap dimension of the dielectric film 17B is preferably less than or equal to about 4.3% of the intersection width, for example. Consequently, it is possible to effectively reduce or prevent deterioration of the characteristics of the acoustic wave devices.

Figure 10:
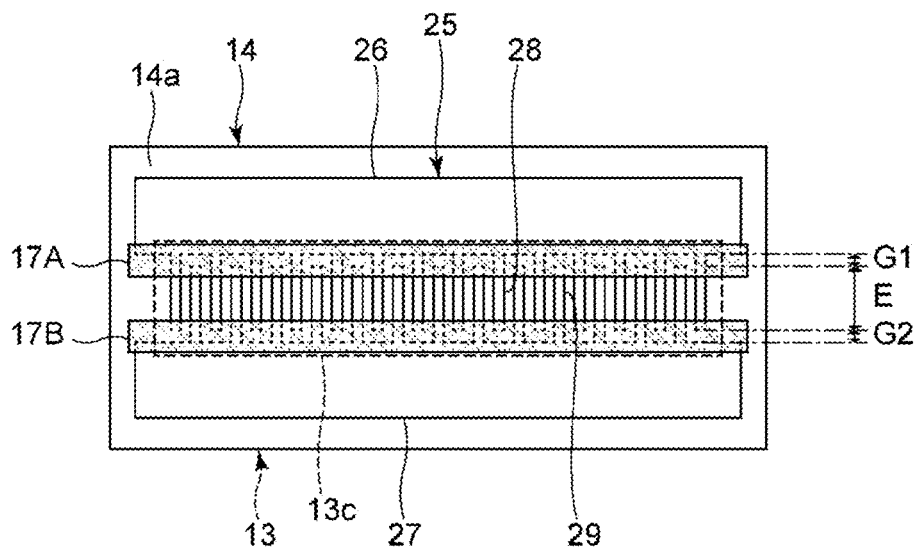
FIG. 10 is a plan view of an acoustic wave device according to a third preferred embodiment of the present invention.

FIG. 10 is a plan view of the acoustic wave device according to the third preferred embodiment.

In the present preferred embodiment, in plan view, a dielectric film 17A overlaps both a first busbar 26 and a plurality of tip end portions of a plurality of second electrode fingers 29. Similarly, in plan view, a dielectric film 17B overlaps both a second busbar 27 and a plurality of tip end portions of a plurality of first electrode fingers 28. Note that, in plan view, it is sufficient for the dielectric film 17B to overlap at least one of the second busbar 27 and the plurality of tip end portions of the plurality of first electrode fingers 28. In plan view, it is sufficient for the dielectric film 17A to overlap at least one of the first busbar 26 and the plurality of tip end portions of the plurality of second electrode fingers 29.

In the second preferred embodiment and the third preferred embodiment, an example in which the portion of the dielectric film 17A provided at the intersection region E and the portion of the dielectric film 17B provided at the intersection region E are the two end portions of the intersection region E in the electrode-finger extending direction has been given. However, the portion of the dielectric film 17A provided at the intersection region E and the portion of the dielectric film 17B provided at the intersection region E are not limited to these two end portions.

In the first preferred embodiment to the third preferred embodiment, the dielectric film 17A and the dielectric film 17B are provided as separate films. Note that the dielectric film 17A and the dielectric film 17B may be integrally provided.

Figure 11:
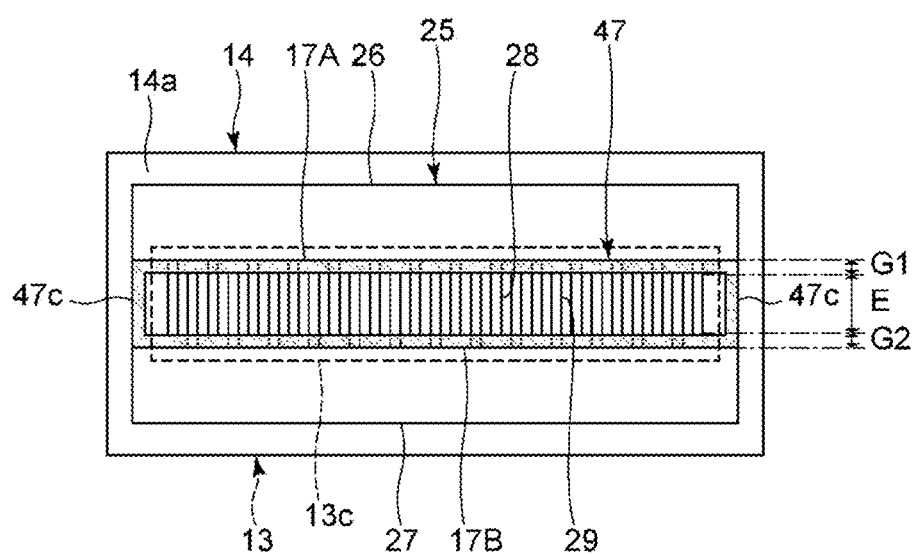
FIG. 11 is a plan view of an acoustic wave device according to a fourth preferred embodiment of the present invention.

FIG. 11 is a plan view of the acoustic wave device according to the fourth preferred embodiment.

In the present preferred embodiment, a dielectric film 47 is provided on a first main surface 14a of a piezoelectric layer 14. The dielectric film 47 is a dielectric film in which a dielectric film 17A and a dielectric film 17B are integrated with each other.

The dielectric film 47 includes the dielectric film 17A, the dielectric film 17B, and two connection portions 47c. One connection portion 47c connects an end portion of the dielectric film 17A to an end portion of the dielectric film 17B, and the other connection portion 47c connects the other end portion of the dielectric film 17A to the other end portion of the dielectric film 17B, the end portions being those in a direction parallel to the electrode-finger facing direction to each other. The dielectric film 47 has a frame shape. More specifically, the dielectric film 47 surrounds an intersection region E.

Note that the dielectric film 47 in which the dielectric film 17A and the dielectric film 17B are integrated with each other need not have a frame shape. For example, the dielectric film 47 may overlap the entire IDT electrode 25 in plan view.

Details of an acoustic wave device using bulk waves in a thickness shear mode are described below. Note that a support member below corresponds to the above-described support substrate.

Figure 12A:
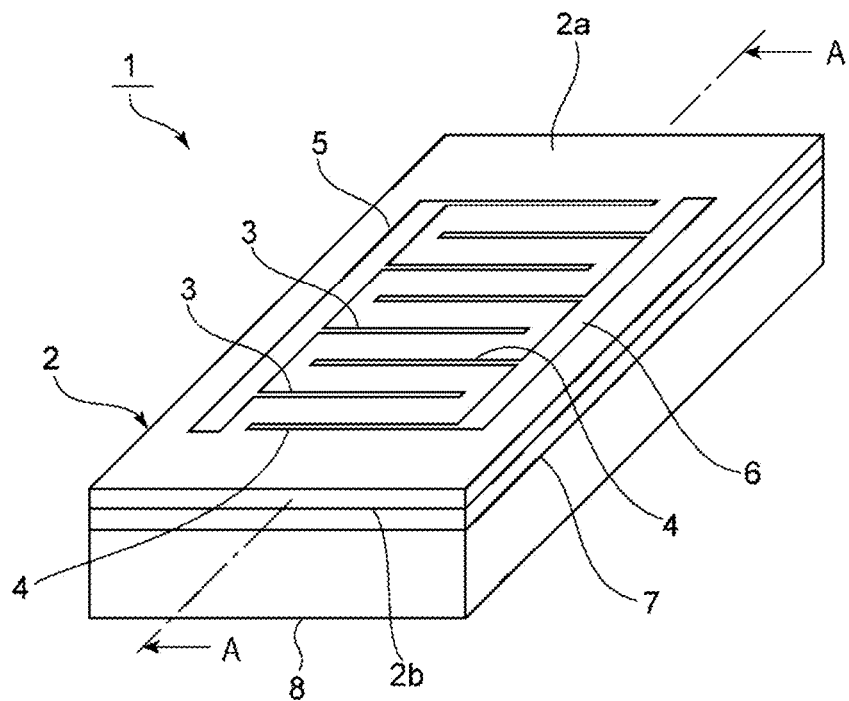
FIG. 12A is a schematic perspective view showing the exterior of an acoustic wave device using bulk waves in a thickness shear mode.
Figure 12B:
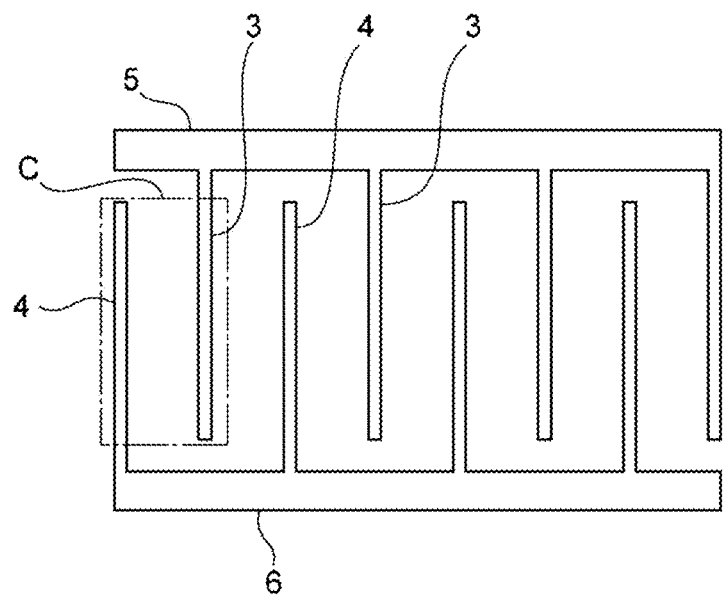
FIG. 12B is a plan view showing an electrode structure at a piezoelectric layer.
Figure 13:
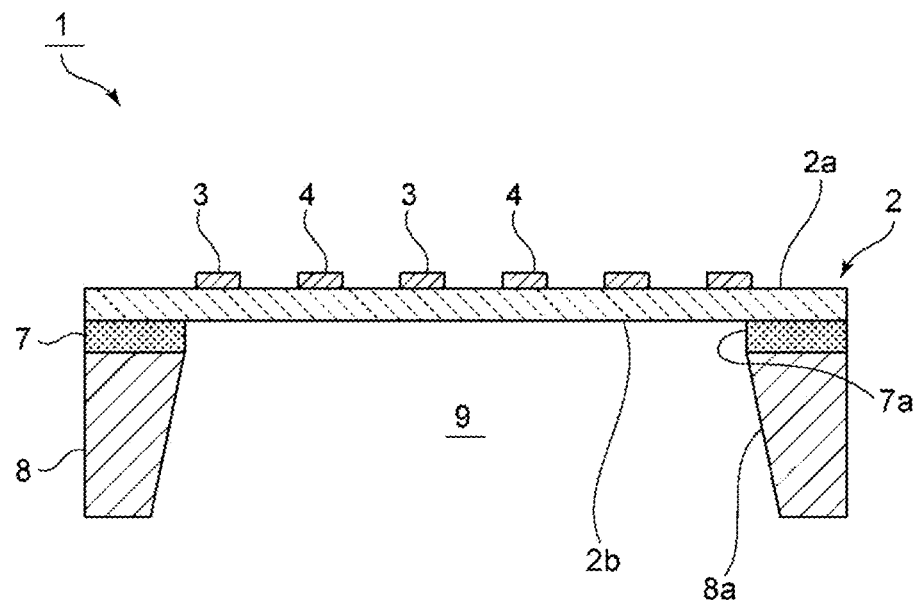
FIG. 13 is a cross-sectional view of a portion along line A-A in FIG. 12A.

FIG. 12A is a schematic perspective view showing the exterior of an acoustic wave device using bulk waves in a thickness shear mode, FIG. 12B is a plan view showing an electrode structure at a piezoelectric layer, and FIG. 13 is a cross-sectional view of a portion along line A-A in FIG. 12A.

An acoustic wave device 1 includes a piezoelectric layer 2 made of $LiNbO_3$. The piezoelectric layer 2 may be made of $LiTaO_3$. Although the cut-angle of $LiNbO_3$ and $LiTaO_3$ is Z-cut, the cut-angle may be rotation Y-cut or X-cut. Although the thickness of the piezoelectric layer 2 is not particularly limited, the thickness of the piezoelectric layer 2 is preferably more than or equal to about 40 nm and less than or equal to about 1000 nm and more preferably more than or equal to about 50 nm and less than or equal to about 1000 nm, for example, to excite the thickness shear mode effectively. The piezoelectric layer 2 includes a first main surface 2a and a second main surface 2b that face each other. An electrode 3 and an electrode 4 are provided on the first main surface 2a. Here, the electrode 3 is one example of the "first electrode", and the electrode 4 is one example of the "second electrode". In FIGS. 12A and 12B, a plurality of electrodes 3 are connected to a first busbar 5. A plurality of the electrodes 4 are connected to a second busbar 6. The plurality of electrodes 3 and the plurality of electrodes 4 interdigitate with each other. The electrodes 3 and the electrodes 4 each have a rectangular or substantially rectangular shape and have a length direction. In a direction orthogonal to this length direction, each electrode 3 faces adjacent one or ones of the electrodes 4. The length directions of the electrodes 3 and 4 and a direction orthogonal to the length directions of the electrodes 3 and 4 are each a direction intersecting the thickness direction of the piezoelectric layer 2. Therefore, it can be said that each electrode 3 and the adjacent one or ones of the electrodes 4 face each other in the direction intersecting the thickness direction of the piezoelectric layer 2. The length directions of the electrodes 3 and 4 may be replaced with a direction orthogonal to the length directions of the electrodes 3 and 4 illustrated in FIGS. 12A and 12B. In other words, in FIGS. 12A and 12B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 12A and 12B. Then, a plurality of pairs of a structure in each of which the electrode 3 connected to one potential and the electrode 4 connected to the other potential are adjacent to each other are provided in the direction orthogonal to the length directions of the aforementioned electrodes 3 and 4. Here, "the electrode 3 and the electrode 4 are adjacent to each other" does not refer to a case in which the electrode 3 and the electrode 4 are disposed in direct contact with each other but refers to a case in which the electrode 3 and the electrode 4 are disposed with a gap interposed therebetween. When the electrode 3 and the electrode 4 are adjacent to each other, electrodes, including the other electrodes 3 and 4, connected to a hot electrode and a ground electrode are not disposed between the electrode 3 and the electrode 4. The number of the pairs is not necessarily an integer number and may be, for example, about 1.5 or about 2.5, for example. A center-to-center distance, that is, a pitch between the electrode 3 and the electrode 4 is preferably within the range from about 1 μm to about 10 μm, for example. The width of each of the electrodes 3 and 4, that is, the dimension thereof in the facing direction of the electrodes 3 and 4 is preferably within the range from about 50 nm to about 1000 nm and more preferably within the range from about 150 nm to about 1000 nm, for example. Note that the center-to-center distance between the centers of the electrodes 3 and 4 is a distance that connects the center of the dimension (width dimension) of the electrode 3 in a direction orthogonal to the length direction of the electrode 3 and the center of a dimension (width dimension) of the electrode 4 in a direction orthogonal to the length direction of the electrode 4 to each other.

In the acoustic wave device 1, a Z-cut piezoelectric layer is used, and thus, the directions orthogonal to the length directions of the electrodes 3 and 4 are directions orthogonal to a polarization direction of the piezoelectric layer 2. The above is not applicable to a case where a piezoelectric body of other cut-angles is used as the piezoelectric layer 2. Here, "orthogonal" does not only refer to orthogonal in the strict sense and may refer to "substantially orthogonal" (an angle formed by the direction orthogonal to the length direction of the electrode 3 or 4 and the polarization direction may be, for example, in the range of about) 90°±10°.

A support member 8 is laminated on the side of the second main surface 2b of the piezoelectric layer 2 with an insulating layer 7 interposed therebetween. The insulating layer 7 and the support member 8 each have a frame shape and, as illustrated in FIG. 13, include through holes 7a and 8a, respectively. Consequently, a cavity portion 9 is formed. The cavity portion 9 is provided so that vibration of excitation regions C of the piezoelectric layer 2 is not obstructed. Accordingly, the support member 8 is laminated on the second main surface 2b with the insulating layer 7 interposed therebetween at a position not overlapping a portion at which at least a pair of the electrodes 3 and 4 is provided. Note that the insulating layer 7 need not be provided. Accordingly, the support member 8 is laminated on the second main surface 2b of the piezoelectric layer 2 directly or indirectly.

The insulating layer 7 is made of silicon oxide. However, an appropriate insulating material, other than silicon oxide, such as silicon oxynitride or alumina is usable. The support member 8 is made of Si. The orientation of Si at a surface on the piezoelectric layer 2 side may be (100) or (110), or may be (111). Desirably, the Si of which the support member 8 is made is highly resistive with a resistivity of more than or equal to about 4 kΩcm, for example. However, the support member 8 can also be made of an appropriate insulating material or an appropriate semiconductor material.

Examples of materials usable as the material of the support member 8 include a piezoelectric body, such as aluminum oxide, lithium tantalate, lithium niobate, or crystal; various types of ceramic materials, such as alumina, magnesia, sapphire, silicon nitride, aluminum nitride, silicon carbide, zirconia, cordierite, mullite, steatite, or forsterite; a dielectric, such as diamond or glass; or a semiconductor, such as gallium nitride.

The plurality of electrodes 3 and 4 and the first and second busbars 5 and 6 are each made of an appropriate metal or an appropriate alloy, such as Al or an AlCu alloy. In the present preferred embodiment, the electrodes 3 and 4, and the first and second busbars 5 and 6 each have a structure in which an Al film is laminated on a Ti film. Note that a close-contact layer other than the Ti film may be used.

An alternating-current voltage is applied between the plurality of electrodes 3 and the plurality of electrodes 4 to perform driving. More specifically, the alternating-current voltage is applied between the first busbar 5 and the second busbar 6. Consequently, it is possible to obtain resonance characteristics by using bulk waves in a thickness shear mode excited in the piezoelectric layer 2. In addition, in the acoustic wave device 1, when the thickness of the piezoelectric layer 2 is d and the center-to-center distance between the centers of, among the plurality of pairs of electrodes 3 and 4, electrodes 3 and 4 that are adjacent to each other is p, d/p is less than or equal to about 0.5, for example. Therefore, bulk waves in the thickness shear mode are effectively excited, and satisfactory resonance characteristics can be obtained. More preferably, d/p is less than or equal to about 0.24, for example. In this case, more satisfactory resonance characteristics can be obtained.

In the acoustic wave device 1, due to having the aforementioned configuration, the Q-value is unlikely to decrease, even when the number of pairs of the electrodes 3 and 4 is reduced to downsize the acoustic wave device 1. This is because, propagation loss is small even when the number of the electrode fingers of reflectors on both sides is reduced. The number of the electrode fingers can be reduced due to the use of bulk waves in the thickness shear mode. A difference between lamb waves used in an acoustic wave device and bulk waves in the thickness shear mode will be described with reference to FIGS. 14A and 14B.

Figure 14A:
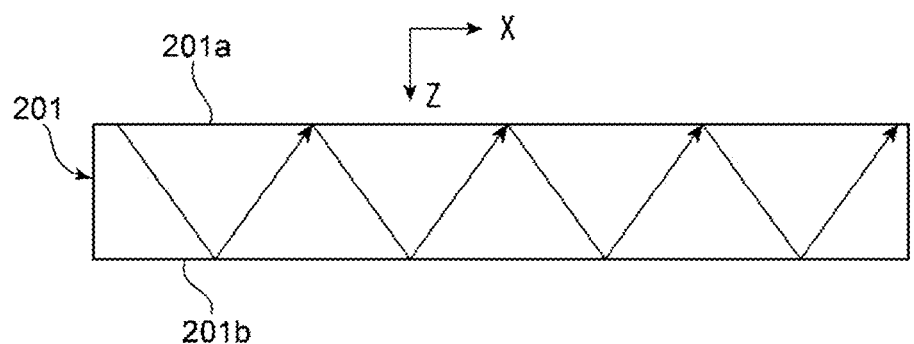
FIG. 14A is a schematic elevational cross-sectional view for describing lamb waves that propagate in a piezoelectric film of an acoustic wave device.

FIG. 14A is a schematic elevational cross-sectional view for describing lamb waves that propagate in a piezoelectric film of an acoustic wave device such as that described in Japanese Unexamined Patent Application Publication No. 2012-257019. Here, waves propagate as indicated by arrows in a piezoelectric film 201. Here, in the piezoelectric film 201, a first main surface 201a and a second main surface 201b face each other, and a thickness direction connecting the first main surface 201a and the second main surface 201b to each other is the Z direction. The X direction is a direction in which electrode fingers of an IDT electrode are disposed side by side. As shown in FIG. 14A, the waves of lamb waves propagate in the X direction in the manner shown in FIG. 14A. Since the waves are plate waves, the waves propagate in the X direction although the piezoelectric film 201 vibrates as a whole. Therefore, reflectors are disposed on two sides to obtain resonance characteristics. Therefore, propagation loss of the waves occurs, and the Q-value decreases when downsizing is performed, in other words, when the number of pairs of the electrode fingers is reduced.

Figure 14B:
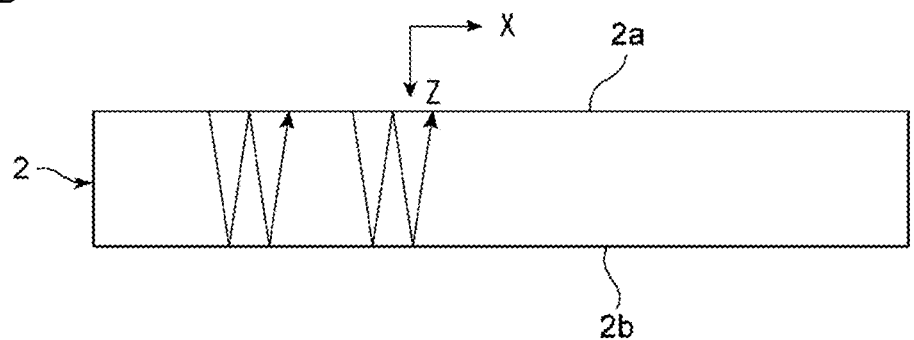
FIG. 14B is a schematic elevational cross-sectional view for describing bulk waves in a thickness shear mode that propagate in the piezoelectric film in the acoustic wave device.

In contrast, as illustrated in FIG. 14B, vibration displacement in the acoustic wave device 1 is in the thickness shear direction, and thus, waves propagate substantially in a direction connecting the first main surface 2a and the second main surface 2b of the piezoelectric layer 2 to each other, that is, in the Z direction and resonates. That is, the X direction component of the waves is significantly smaller than the Z direction component of the waves. Since resonance characteristics are obtained by the propagation of the waves in this Z direction, propagation loss is unlikely to occur even when the number of the electrode fingers of reflectors is reduced. Further, even when the number of pairs of electrode pairs defined by the electrodes 3 and 4 is reduced for downsizing, the Q-value is unlikely to decrease.

Figure 15:
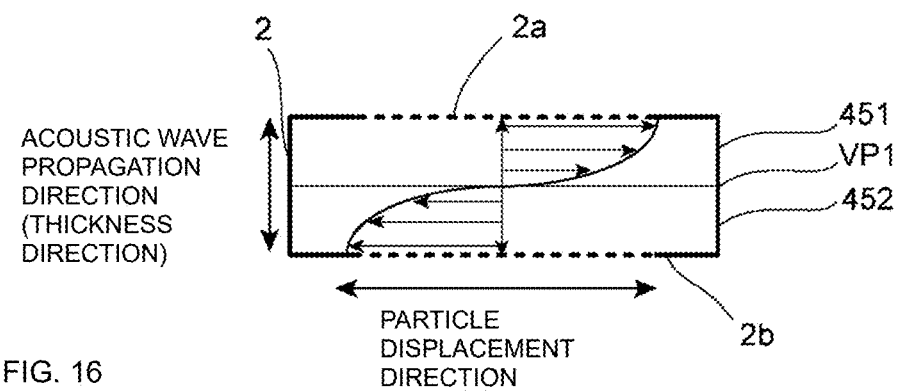
FIG. 15 shows an amplitude direction of bulk waves in a thickness shear mode.

As illustrated in FIG. 15, the amplitude direction of bulk waves in the thickness shear mode for a first excitation region 451 included in the excitation regions C of the piezoelectric layer 2 and the amplitude direction of bulk waves in the thickness shear mode for a second excitation region 452 included in the excitation regions C are opposite to each other. FIG. 15 schematically illustrates bulk waves when a voltage that causes the electrode 4 to have a higher potential than the electrode 3 is applied between the electrode 3 and the electrode 4. The first excitation region 451 is a region included in the excitation regions C and present between the first main surface 2a and an imaginary plane VP1 orthogonal to the thickness direction of the piezoelectric layer 2 and dividing the piezoelectric layer 2 in two. The second excitation region 452 is a region included in the excitation regions C and present between the second main surface 2b and the imaginary plane VP1.

Although, as described above, at least one pair of electrodes defined by the electrode 3 and the electrode 4 is disposed in the acoustic wave device 1, the pair of electrodes is not for causing waves to propagate in the X direction. Therefore, a plurality of electrode pairs defined by the electrode 3 and the electrode 4 are not required. In other words, it is sufficient that at least one pair of the electrodes is provided.

For example, the electrode 3 is an electrode that is connected to a hot potential, and the electrode 4 is an electrode that is connected to a ground potential. However, the electrode 3 may be connected to a ground potential while the electrode 4 may be connected to a hot potential. In the present preferred embodiment, each electrode of at least one pair of electrodes is, as described above, an electrode connected to a hot potential or an electrode connected to a ground potential, and no floating electrode is provided.

Figure 16:
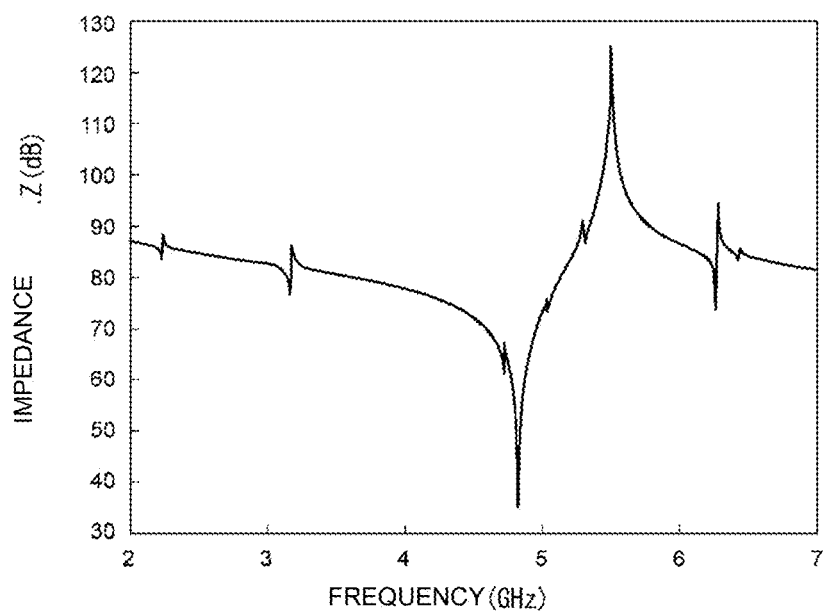
FIG. 16 is a graph showing resonance characteristics of an acoustic wave device using bulk waves in a thickness shear mode.

FIG. 16 is a graph showing resonance characteristics of the acoustic wave device illustrated in FIG. 13. Note that design parameters of an example of the acoustic wave device 1 with which the resonance characteristics are obtained are as follows.

Piezoelectric layer 2: LiNbO$_3$ having Euler angles (0°, 0°, 90°), thickness=400 nm The length of a region in which the electrode 3 and the electrode 4 overlap each other when viewed in a direction orthogonal to the length directions of the electrode 3 and the electrode 4, in other words, the length of each of the excitation regions C=40 μm, the number of pairs of the electrodes defined by the electrodes 3 and 4=21 pairs, the center-to-center distance between the centers of the electrodes=3 μm, the width of each of the electrodes 3 and 4=500 nm, and d/p=0.133

Insulating layer 7: a silicon oxide film having a thickness of 1 μm

Support member 8: Si

Note that the length of each of the excitation regions C is a dimension of each of the excitation regions C in the length directions of the electrodes 3 and 4.

In the present preferred embodiment, the distance between electrodes of an electrode pair defined by the electrodes 3 and 4 is the same among all plurality of the pairs. In other words, the electrodes 3 and the electrodes 4 are disposed at an equal pitch.

FIG. 16 clearly shows that satisfactory resonance characteristics in which the fractional band is about 12.5%, for example, can be obtained despite the absence of reflectors.

Meanwhile, when the thickness of the piezoelectric layer 2 is d and the electrode center-to-center distance between the center of the electrode 3 and the center of the electrode 4 is p, as described above, in the present preferred embodiment, d/p is less than or equal to about 0.5, and is more preferably less than or equal to about 0.24, for example. This will be described with reference to FIG. 17.

Figure 17:
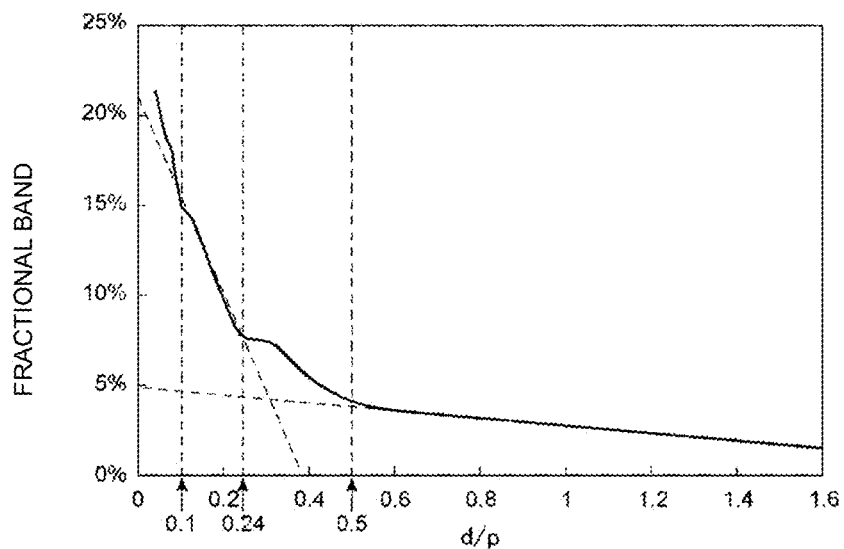
FIG. 17 is a graph showing a relationship between d/p and a fractional band as a resonator, where a center-to-center distance between the centers of adjacent electrodes is p and the thickness of a piezoelectric layer is d.

Similarly to the acoustic wave device with which the resonance characteristics indicated in FIG. 16 were obtained, a plurality of acoustic wave devices were obtained where d/p was varied. FIG. 17 is a graph showing a relationship between the d/p and the fractional band as a resonator of an acoustic wave device.

FIG. 17 clearly shows that, when d/p>about 0.5 is satisfied, the fractional band is less than about 5%, for example, even when d/p is adjusted. In contrast, when d/p≤about 0.5 is satisfied, it is possible to cause the fractional band to be more than or equal to about 5% by changing d/p within the range, for example. In other words, it is possible to form a resonator that has a high coupling coefficient. When d/p is less than or equal to about 0.24, the fractional band can be increased to be more than or equal to about 7%, for example. In addition, by adjusting d/p within this range, it is possible to obtain a resonator having a wider fractional band and to realize a resonator having a higher coupling coefficient. Accordingly, it was discovered and confirmed that, by setting d/p to be less than or equal to about 0.5, for example, it is possible to form a resonator using bulk waves in the thickness shear mode and that has a high coupling coefficient.

Figure 18:
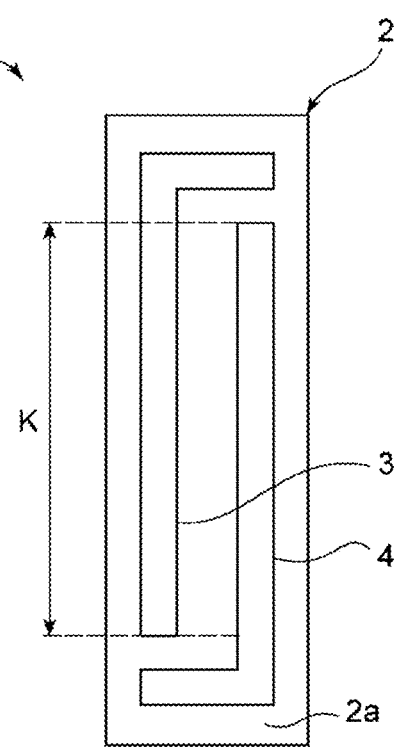
FIG. 18 is a plan view of an acoustic wave device using bulk waves in a thickness shear mode.

FIG. 18 is a plan view of an acoustic wave device using bulk waves in a thickness shear mode. In an acoustic wave device 80, a pair of electrodes including an electrode 3 and an electrode 4 is provided on a first main surface 2a of a piezoelectric layer 2. Note that, in FIG. 18, K is an intersection width. As described above, the number of pairs of electrodes may be one in the acoustic wave device according to the present preferred embodiment of the present invention. Even in this case, it is also possible to effectively excite bulk waves in a thickness shear mode when the aforementioned d/p is less than or equal to about 0.5, for example.

Figure 19:
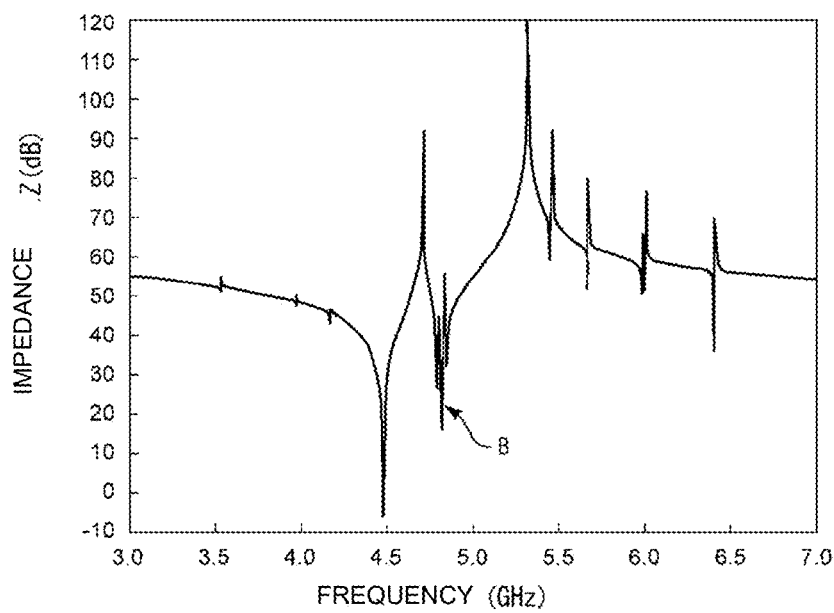
FIG. 19 is a graph showing resonance characteristics of an acoustic wave device of a reference example in which a spurious appears.

Preferably, in the acoustic wave device 1, a metallization ratio MR of, among a plurality of electrodes 3 and 4, electrodes 3 and 4 adjacent to each other with respect to an excitation region C, which is a region in which the electrodes 3 and 4 adjacent to each other overlap each other when viewed in a direction in which the electrodes 3 and 4 adjacent to each other face each other, satisfies MR≤about 1.75(d/p)+0.075, for example. In such a case, it is possible to effectively cause a spurious to be small. This will be described with reference to FIG. 19 and FIG. 20. FIG. 19 is a reference graph showing one example of resonance characteristics of the acoustic wave device 1. A spurious indicated by arrow B appears between the resonant frequency and the anti-resonant frequency. Note that d/p=about 0.08 and LiNbO₃ has Euler angles (0°, 0°, 90°), for example. In addition, the metallization ratio MR=about 0.35, for example.

The metallization ratio MR will be described with reference to FIG. 12B. When one pair of electrodes 3 and 4 is focused upon in the electrode structure in FIG. 12B, it is assumed that only this one pair of electrodes 3 and 4 is provided. In this case, a portion surrounded by an alternate long and short dashed line is an excitation region C. This excitation region C is a region in the electrode 3 overlapping the electrode 4, a region in the electrode 4 overlapping the electrode 3, and a region in which the electrode 3 and the electrode 4 overlap each other in a region between the electrode 3 and the electrode 4, when the electrode 3 and the electrode 4 are viewed in a direction orthogonal to the length directions of the electrodes 3 and 4, that is, in the facing direction. The ratio of the areas of the electrodes 3 and 4 in the excitation region C to the area of this excitation region C is the metallization ratio MR. In other words, the metallization ratio MR is a ratio of the area of a metallization portion to the area of the excitation region C.

When a plurality of pairs of electrodes are provided, a ratio of the metallization portion included in all excitation regions to the total of the areas of the excitation regions can be considered as MR.

Figure 20:
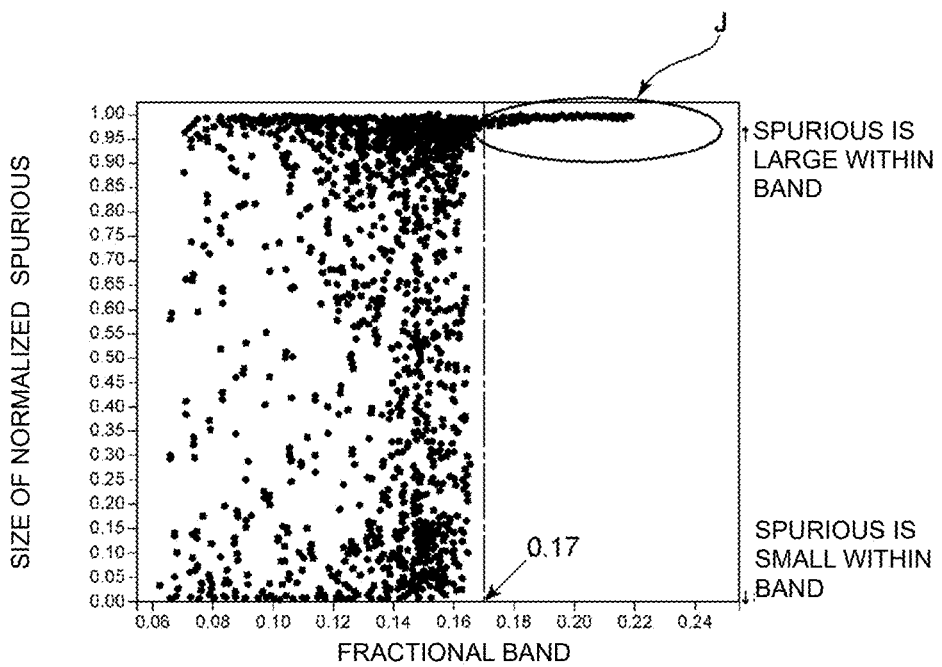
FIG. 20 is a graph showing a relationship between a fractional band and the phase rotation amount of an impedance of a spurious normalized by 180 degrees as the size of the spurious.

FIG. 20 is a graph showing a relationship between a fractional band when a large number of acoustic wave resonators are formed according to the present preferred embodiment and the phase rotation amount of an impedance of a spurious normalized by 180 degrees as the size of the spurious. Note that the fractional band was adjusted by variously changing the film thickness of the piezoelectric layer and the dimensions of the electrodes. FIG. 20 shows results when a piezoelectric layer made of Z-cut LiNbO₃ was used. However, a case where a piezoelectric layer of other cut-angles is used has the same tendency.

The spurious is about 1.0, for example, which is large, in a region surrounded by the ellipse J in FIG. 20. FIG. 20 clearly shows that when the fractional band exceeds about 0.17, in other words, exceeds about 17%, for example, a large spurious whose spurious level is more than or equal to 1 appears in the pass band even when parameters that define the fractional band are changed. In other words, as with the resonance characteristics shown in FIG. 19, a large spurious indicated by the arrow B appears in the band. Therefore, the fractional band is preferably less than or equal to about 17%, for example. In this case, it is possible to cause the spurious to be small by adjusting the film thickness of the piezoelectric layer 2, the dimensions of the electrodes 3 and 4, and the like.

Figure 21:
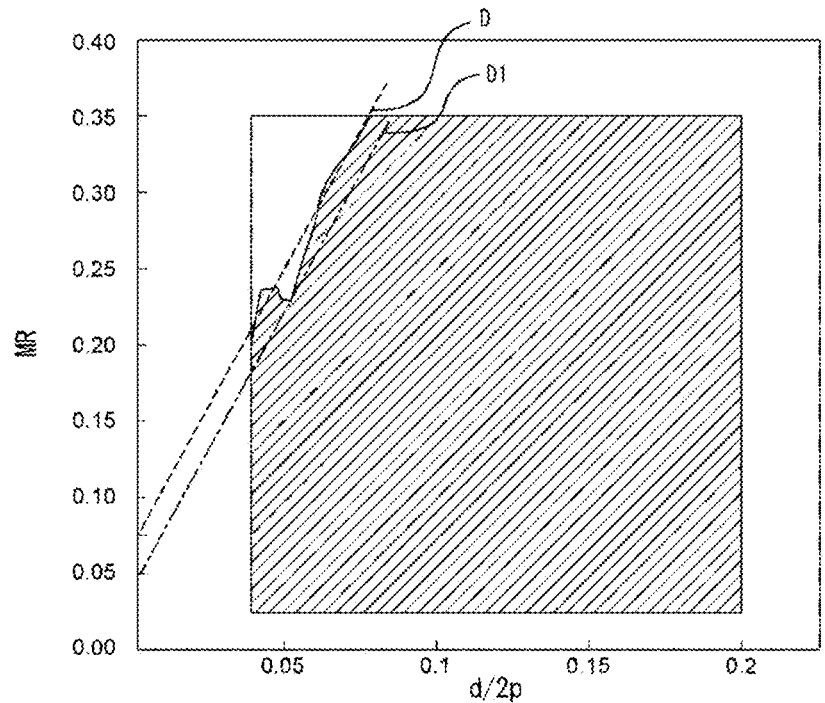
FIG. 21 is a graph showing a relationship between d/2p and a metallization ratio MR.

FIG. 21 is a graph showing a relationship among d/2p, the metallization ratio MR, and the fractional band. Various acoustic wave devices in which d/2p and MR differed in the above-described acoustic wave device were formed, and the fractional band was measured. In FIG. 21, the hatched portion on the right side of the dashed line D is a region in which the fractional band is less than or equal to about 17%, for example. The boundary between the hatched region and a non-hatched region is expressed by MR=about 3.5(d/2p)+0.075, for example. In other words, MR=about 1.75(d/p)+0.075, for example. Thus, preferably, MR≤about 1.75(d/p)+0.075, for example. In such a case, the fractional band is likely to be less than or equal to about 17%, for example. A region on the right side of MR=about 3.5(d/2p)+0.05 indicated by the alternate long and shorted dashed line D1 in FIG. 21 is more preferable. In other words, when MR≤about 1.75(d/p)+0.05 is satisfied, it is possible to reliably cause the fractional band to be less than or equal to about 17%, for example.

Figure 22:
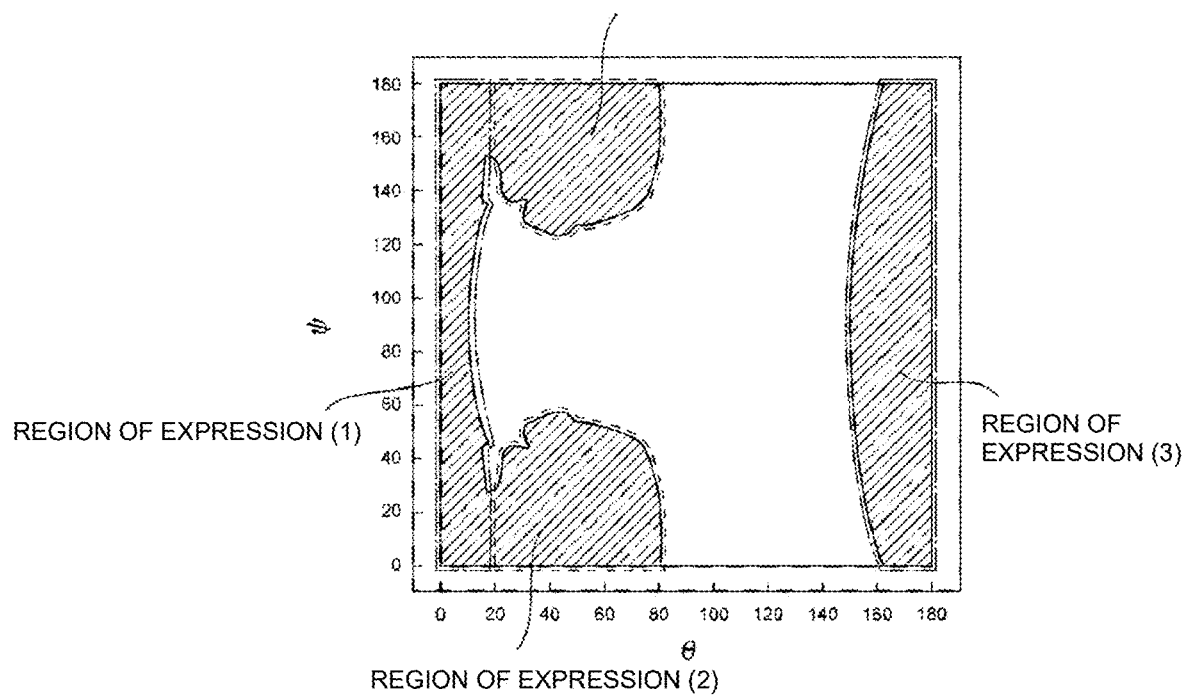
FIG. 22 is a graph showing a map of a fractional band with respect to Euler angles (0°, θ, ψ) of LiNbO$_3$ when d/p is set as close as possible to zero.

FIG. 22 is a graph showing a map of the fractional band with respect to the Euler angles (0°, 0, y) of LiNbO₃ when d/p is set as close as possible to zero. The hatched portion in FIG. 22 is a region in which a fractional band of at least more than or equal to about 5% is obtained, for example. When the range of the region is approximated, the range is expressed by Expression (1), Expression (2), or Expression (3) below.

$$(0°\pm10°, 0° \text{ to } 20°, \text{optional } \psi) \quad (1)$$

$$(0°\pm10°, 20° \text{ to } 80°, 0° \text{ to } 60° (1-(\theta-50)^2/900)^{1/2}) \text{ or}$$
$$(0°\pm10°, 20° \text{ to } 80°, [180°-60°$$
$$(1-(\theta-50)^2/900)^{1/2}] \text{ to } 180°) \quad (2)$$

$$(0°\pm10°, [180°-30° (1-(\psi-90)^2/8100)^{1/2}] \text{ to } 180°,$$
$$\text{optional } \psi) \quad (3)$$

Accordingly, in the Euler angle range expressed by Expression (1), Expression (2), or Expression (3) above, the fractional band can be sufficiently widened, which is preferable. This is also true when the piezoelectric layer 2 is a lithium tantalate layer.

In the acoustic wave devices, which use bulk waves in the thickness shear mode, of the first preferred embodiment to the fourth preferred embodiment and each modification, as mentioned above, d/p is preferably less than or equal to about 0.24, for example. This makes it possible to obtain more satisfactory resonance characteristics. Further, in the acoustic wave devices, which use bulk waves in the thickness shear mode, of the first preferred embodiment to the fourth preferred embodiment and each modification, as mentioned above, it is preferable that MR≤about 1.75(d/p)+0.075 be satisfied, for example. In this case, it is possible to more reliably reduce or prevent a spurious.

The piezoelectric layer in the acoustic wave devices, which use bulk waves in the thickness shear mode, of the first preferred embodiment to the fourth preferred embodiment and each modification is preferably made of lithium niobate or lithium tantalate. The Euler angles (φ, θ, ψ) of the lithium niobate or the lithium tantalate of which the piezoelectric layer is made is preferably in the range of Expression (1), Expression (2), or Expression (3) above. In this case, it is possible to sufficiently widen the fractional band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support including a support substrate;
   a piezoelectric layer on the support;
   an IDT electrode on the piezoelectric layer and including two busbars and a plurality of electrode fingers, the two busbars being a busbar pair and facing each other; and
   a dielectric film that is provided on the piezoelectric layer so as to overlap at least a portion of the IDT electrode in plan view; wherein
   a ratio d/p is less than or equal to about 0.5, where a thickness of the piezoelectric layer is d and a center-to-center distance between centers of adjacent ones of the electrode fingers is p;
   MR≤about 1.75(d/p)+0.075 is satisfied, where a metallization ratio of the plurality of electrode fingers with respect to the intersection region is MR;

a cavity that opens on a side of the piezoelectric layer is provided in the support, and, in plan view, at least a portion of the IDT electrode and the cavity overlap each other;

the IDT electrode includes an intersection region and two gap regions, the intersection region being a region in which the adjacent ones of the electrode fingers overlap each other when viewed in a direction in which the adjacent ones of the electrode fingers face each other, the two gap regions each being positioned between the intersection region and a corresponding one of the two busbars; and the dielectric film is provided at at least a portion of the two gap regions, and a thermal conductivity of the dielectric film is higher than a thermal conductivity of the piezoelectric layer.

2. The acoustic wave device according to claim 1, wherein, in plan view, the dielectric film and at least one of the busbar pair and a plurality of tip end portions of the plurality of electrode fingers overlap each other.

3. The acoustic wave device according to claim 2, wherein, in the plan view, the dielectric film and both of the busbar pair and the plurality of tip end portions of the plurality of electrode fingers overlap each other.

4. The acoustic wave device according to claim 1, wherein the dielectric film is provided at at least a portion of the intersection region.

5. The acoustic wave device according to claim 4, wherein the dielectric film is not provided at another portion of the intersection region.

6. The acoustic wave device according to claim 5, wherein
when a direction in which the plurality of electrode fingers extend is an electrode-finger extending direction, the dielectric film is provided at two end portions of the intersection region in the electrode-finger extending direction; and
when a dimension of the intersection region in the electrode-finger extending direction is an intersection width, a total of dimensions in the electrode finger extending direction of portions of the dielectric film provided at a corresponding one of the two end portions of the intersection region and dimensions in the electrode-finger extending direction of portions of the dielectric film provided at a corresponding one of the gap regions is less than or equal to about 10% of the intersection width.

7. The acoustic wave device according to claim 6, wherein the dielectric film is not provided at a portion of the intersection region other than the two end portions.

8. The acoustic wave device according to claim 1, wherein the dielectric film is made of aluminum nitride, aluminum oxide, beryllium oxide, silicon carbide, or silicon nitride.

9. The acoustic wave device according to claim 1, wherein an order of placement of the piezoelectric layer, the IDT electrode, and the dielectric film upon each other is the piezoelectric layer, the IDT electrode, and the dielectric film.

10. The acoustic wave device according to claim 1, wherein an order of placement of the piezoelectric layer, the IDT electrode, and the dielectric film upon each other is the piezoelectric layer, the dielectric film, and the IDT electrode.

11. The acoustic wave device according to claim 1, wherein
the support includes an insulating layer between the support substrate and the piezoelectric layer; and
the cavity is provided in the insulating layer.

12. The acoustic wave device according to claim 11, wherein the cavity is provided in the insulating layer and in the support substrate.

13. The acoustic wave device according to claim 1, wherein the ratio d/p is less than or equal to about 0.24.

14. The acoustic wave device according to claim 1, wherein the cavity is provided in the support substrate.

15. The acoustic wave device according to claim 1, wherein the dielectric film is a first dielectric film, and the acoustic wave device further comprises a second dielectric film, and the first dielectric film is provided in a first of the two gap regions and the second dielectric film is provided in a second of the two gap regions.

16. The acoustic wave device according to claim 15, wherein the thermal conductivities of the first and second dielectric films are higher than the thermal conductivity of the piezoelectric layer.

17. The acoustic wave device according to claim 15, wherein the first dielectric film and the second dielectric film are integrally provided.

18. The acoustic wave device according to claim 15, wherein the first dielectric film and the second dielectric film are separate films.

19. The acoustic wave device according to claim 1, wherein the acoustic wave device is structured to generate bulk waves in a thickness shear mode.

20. An acoustic wave device comprising:
a support including a support substrate;
a piezoelectric layer on the support;
an IDT electrode on the piezoelectric layer and including two busbars and a plurality of electrode fingers, the two busbars being a busbar pair and facing each other; and
a dielectric film that is provided on the piezoelectric layer so as to overlap at least a portion of the IDT electrode in plan view; wherein
the acoustic wave device is structured to generate bulk waves in a thickness shear mode;
a ratio d/p is less than or equal to about 0.24, where a thickness of the piezoelectric layer is d and a center-to-center distance between centers of adjacent ones of the electrode fingers is p;
MR≤about 1.75(d/p)+0.075 is satisfied, where a metallization ratio of the plurality of electrode fingers with respect to the intersection region is MR;
a cavity that opens on a side of the piezoelectric layer is provided in the support, and, in plan view, at least a portion of the IDT electrode and the cavity overlap each other;
the IDT electrode includes an intersection region and two gap regions, the intersection region being a region in which the adjacent ones of the electrode fingers overlap each other when viewed in a direction in which the adjacent ones of the electrode fingers face each other, the two gap regions each being positioned between the intersection region and a corresponding one of the two busbars; and
the dielectric film is provided at at least a portion of the two gap regions, and a thermal conductivity of the dielectric film is higher than a thermal conductivity of the piezoelectric layer.

* * * * *